(12) United States Patent
Biskeborn et al.

(10) Patent No.: US 8,679,733 B2
(45) Date of Patent: Mar. 25, 2014

(54) PATTERNING PROCESS FOR SMALL DEVICES

(75) Inventors: Robert G. Biskeborn, Hollister, CA (US); Cherngye Hwang, San Jose, CA (US); Calvin S. Lo, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 13/009,758

(22) Filed: Jan. 19, 2011

(65) Prior Publication Data
US 2012/0183907 A1 Jul. 19, 2012

(51) Int. Cl.
*G03F 7/20* (2006.01)

(52) U.S. Cl.
USPC .......................................... 430/320; 430/323

(58) Field of Classification Search
None
See application file for complete search history.

(56) References Cited

U.S. PATENT DOCUMENTS

| | | | |
|---|---|---|---|
| 4,423,450 A | 12/1983 | Hamilton | |
| 4,439,793 A | 3/1984 | Nater | |
| 4,956,737 A | 9/1990 | Brock | |
| 5,289,328 A | 2/1994 | Saliba | |
| 5,310,623 A * | 5/1994 | Gal | 430/321 |
| 5,452,165 A | 9/1995 | Chen et al. | |
| 5,475,553 A | 12/1995 | Saliba | |
| 5,862,014 A | 1/1999 | Nute | |
| 5,883,770 A | 3/1999 | Biskeborn et al. | |
| 6,018,444 A * | 1/2000 | Beck et al. | 360/121 |
| 6,038,108 A | 3/2000 | Dee et al. | |
| 6,118,626 A | 9/2000 | Muftu et al. | |
| 6,122,147 A | 9/2000 | Fahimi et al. | |
| 6,301,051 B1 | 10/2001 | Sankur | |
| 6,350,178 B2 | 2/2002 | Weiss et al. | |
| 6,433,959 B1 | 8/2002 | Lakshmikumaran et al. | |
| 6,534,221 B2 | 3/2003 | Lee et al. | |
| 6,606,219 B2 | 8/2003 | Lam | |
| 6,624,960 B1 | 9/2003 | Langiano et al. | |
| 6,690,542 B1 | 2/2004 | Wang | |
| 6,972,931 B2 | 12/2005 | Rudi et al. | |
| 7,008,737 B2 | 3/2006 | Morales et al. | |
| 7,209,324 B2 | 4/2007 | Brock et al. | |
| 7,239,465 B1 | 7/2007 | Watson et al. | |
| 7,271,983 B2 | 9/2007 | Saliba | |
| 7,359,156 B2 | 4/2008 | Biskeborn | |

(Continued)

FOREIGN PATENT DOCUMENTS

| | | |
|---|---|---|
| DE | 3318902 A1 | 11/1984 |
| JP | 7-029141 A * | 1/1995 |
| JP | 2007-041024 A * | 2/2007 |

OTHER PUBLICATIONS

Comnputer-generated translation of JP 7-029141 (Jan. 1995).*

(Continued)

*Primary Examiner* — John A. McPherson
(74) *Attorney, Agent, or Firm* — Zilka-Kotab, PC (57) ABSTRACT

A method according to one embodiment includes applying a photoresist to a substrate; exposing the photoresist such that a local intensity of radiation applied to the photoresist at each pixel thereof is a function of a mathematically-generated representation of a target surface shape; developing the resist; and performing a subtractive process on the developed photoresist and the substrate for creating the target surface shape on the substrate. A method according to another embodiment includes applying a photoresist to a substrate; patterning the photoresist using a machine-readable profile; and performing a subtractive process to transfer the profile onto the substrate.

17 Claims, 11 Drawing Sheets

(56) References Cited

U.S. PATENT DOCUMENTS

| | | |
|---|---|---|
| 7,414,811 B2 | 8/2008 | Biskeborn |
| 7,467,757 B2 | 12/2008 | Biskeborn et al. |
| 7,585,596 B1 | 9/2009 | Johnson et al. |
| 7,646,565 B2 | 1/2010 | Biskeborn et al. |
| 7,656,602 B2 | 2/2010 | Iben et al. |
| 7,660,072 B2 | 2/2010 | Biskeborn et al. |
| 7,724,465 B2 | 5/2010 | Koeppe |
| 7,751,154 B2 | 7/2010 | Wu |
| 8,373,944 B2 | 2/2013 | Biskeborn |
| 8,542,460 B2 | 9/2013 | Biskeborn et al. |
| 2002/0018964 A1 | 2/2002 | Jerominek |
| 2003/0076631 A1 | 4/2003 | Torline et al. |
| 2003/0154908 A1 | 8/2003 | Webber et al. |
| 2004/0095674 A1* | 5/2004 | Yip et al. .................. 360/122 |
| 2004/0150915 A1* | 8/2004 | Thomas et al. ............ 360/235.8 |
| 2004/0228034 A1 | 11/2004 | Nakao et al. |
| 2005/0053844 A1 | 3/2005 | Wu |
| 2005/0122631 A1 | 6/2005 | Biskeborn et al. |
| 2005/0207062 A1 | 9/2005 | Johnson |
| 2005/0284207 A1 | 12/2005 | Biskeborn et al. |
| 2006/0232884 A1 | 10/2006 | Biskeborn |
| 2006/0236295 A1* | 10/2006 | Baba-Ali .................. 716/19 |
| 2007/0183091 A1 | 8/2007 | Saliba |
| 2008/0049358 A1 | 2/2008 | Biskeborn et al. |
| 2008/0062390 A1* | 3/2008 | Zhang et al. .................. 355/47 |
| 2008/0170328 A1 | 7/2008 | Kawakami et al. |
| 2008/0218903 A1 | 9/2008 | Biskeborn |
| 2009/0189302 A1 | 7/2009 | Fujita et al. |
| 2009/0231756 A1 | 9/2009 | Koeppe |
| 2009/0231757 A1 | 9/2009 | Biskeborn et al. |
| 2009/0268343 A1 | 10/2009 | Biskeborn et al. |
| 2010/0053810 A1 | 3/2010 | Biskeborn et al. |
| 2012/0300338 A1 | 11/2012 | Biskeborn |

OTHER PUBLICATIONS

Computer-generated translation of JP 2007-041024 (Feb. 2007).*
U.S. Appl. No. 12/047,116, filed Mar. 12, 2008.
Restriction Requirement from U.S. Appl. No. 12/047,116 dated Feb. 15, 2011.
Notice of Allowance and Fee(s) due from U.S. Appl. No. 13/177,013 dated Oct. 9, 2012.
Non-Final Office Action Summary from U.S. Appl. No. 12/047,116 dated Sep. 6, 2011.
Restriction/Election Requirement from U.S. Appl. No. 12/831,149 dated Dec. 3, 2012.
Non-Final Office Action from U.S. Appl. No. 12/831,149 dated Dec. 21, 2012.
"AZ 9260 Photoresist (520CPS) (US)," Safety Data Sheet, Substance SXR 109902, Version 3.1, Revision Date Mar. 16, 2011, pp. 1-12.
Non-Final Office Action Summary from U.S. Appl. No. 12/047,116 dated Mar. 28, 2012.
Final Office Action Summary from U.S. Appl. No. 12/047,116 dated Jan. 30, 2013.
Non-Final Office Action Summary from U.S. Appl. No. 12/047,116 dated Mar. 22, 2011.
U.S. Appl. No. 12/831,149, filed Jul. 6, 2010.
U.S. Appl. No. 13/117,013, filed May 26, 2011.
Restriction/Election Requirement from U.S. Appl. No. 12/047,116 dated Feb. 15, 2011.
Non-Final Office Action Summary from U.S. Appl. No. 12/047,116 dated Aug. 14, 2012.
Final Office Action Summary from U.S. Appl. No. 12/047,116 dated Dec. 21, 2011.
Final Office Action Summary from U.S. Appl. No. 12/831,149 dated Jul. 12, 2013.

* cited by examiner

PATTERNING PROCESS FOR SMALL DEVICES

BACKGROUND

The present invention relates to patterning processes, and more particularly, this invention relates to methods for patterning small devices using graded photolithography and subtractive processes.

BRIEF SUMMARY

A method according to one embodiment includes applying a photoresist to a substrate; exposing the photoresist such that a local intensity of radiation applied to the photoresist at each pixel thereof is a function of a mathematically-generated representation of a target surface shape; developing the resist; and performing a subtractive process on the developed photoresist and the substrate for creating the target surface shape on the substrate.

A method according to another embodiment includes applying a photoresist to a substrate; patterning the photoresist using a machine-readable profile; and performing a subtractive process to transfer the profile onto the substrate.

Other aspects, advantages and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of methods for patterning small devices, such as tape and disk heads. The techniques described below enable fabrication of contoured (e.g., curved, tapered and/or other) shapes on structures including hard, not easily machinable substrates such as AlTiC ceramic.

In one general embodiment, a method includes applying a photoresist to a substrate; exposing the photoresist such that a local intensity of radiation (e.g., light) applied to the photoresist at each pixel thereof is a function of a mathematically-generated representation of a target surface shape; developing the resist; and performing a subtractive process on the developed photoresist and the substrate for creating the target surface shape on the substrate.

In another general embodiment, a method includes applying a photoresist to a substrate; patterning the photoresist using a machine-readable profile; and performing a subtractive process to transfer the profile onto the substrate.

One aspect of the present invention includes a combination of graded exposure technology, photolithography and a removal process (e.g., etching, milling, etc.), that enables fabrication of contoured shapes in hard, not easily machined, substrates, such as AlTiC ceramic. A key advantage is high precision shaping and high volume batch processing capability. In one embodiment, MOEMS (micro-opto-electromechanical technology) is used for maskless patterning of the photoresist. This has the advantage of design flexibility. In another embodiment, a graded photo mask is used to provide the same type of exposure as the MOEMS maskless method. Both methods are discussed in more detail below.

In various approaches, the surface to be profiled is photoresist patterned and then etched via ion-milling or reactive ion etching (RIE), as examples. The resist pattern controls the finished shape by altering the rate at which material is removed by the etching process.

A unique aspect of these processes it the ability to create relatively wide features having shallow slopes, and ability to vary the shape in an arbitrary manner across the surface. Another capability is, for example, batch processing of rowbars of electronics, e.g., of tape head sliders as described in detail below; rowbars of hard disk drive sliders; diced heads and/or sliders; etc.

In summary, various embodiments of the present invention enable patterning of surfaces in a batch mode and with intricate features, where neither of these aspects is reasonably achievable using conventional machining. In addition, these advantages hold up in comparison to conventional photo processing.

In a tape drive system, magnetic tape is moved over the surface of the tape head at high speed. Usually the tape head is designed to minimize the spacing between the head and the tape by reducing the air film between head and tape. The spacing between the magnetic head and the magnetic tape is crucial so that the recording gaps of the transducers, which are the source of the magnetic recording flux, are close to the tape to effect efficient signal transfer, and so that the read element is close to the tape to provide effective coupling of the magnetic field from the tape to the read element.

However, this close spacing has resulted in various tribological issues becoming more pronounced, among them, tape/head stiction and running friction. Particularly, as the linear density of magnetic tape recording increases, the magnetic spacing must be reduced, requiring smoother heads and tapes. These may be associated with increased startup friction (stiction), increased running friction, and more instantaneous speed variations (ISVs).

This friction/stiction problem can be alleviated by roughening the tape bearing surface, but such roughening may increase tape wear. Furthermore, this roughening may be filled by tape debris or worn away by the tape. In some cases, a mechanism to reduce friction may be utilized. In this case, the reading and writing portion of the head is surrounded with a separate contoured surface.

Yet another approach includes tapering or rounding the tape-supporting portions of tape bearing surface. Conventional photolithographic methods cannot easily achieve contoured surfaces, such as are required for shaping magnetic recording heads to alleviate head-media performance degradation. Examples include disk damage due to sharp corners on the slider, and friction and stiction in disk and tape recording heads.

Machining can be an alternative to photolithography. Methods for creating, e.g., tape head modules with a curved profile include tape lapping and grooved hard lapping plate. These have drawbacks including low throughput and limited precision and design flexibility.

Future head tape interfaces will demand improvements in tape bearing surface design for reducing friction and wear at interface while also enabling minimal head-element spacing for high areal density.

FIGS. 1A-1F depict a process for patterning a small device according to one embodiment of the present invention. In the embodiment shown, the device is a tape module. Illustrative constructions and uses of such tape modules are described below.

Assume that a batch of tape head modules 10 are to be patterned, where each batch includes 16 rowbars per carrier× 12 carriers equals 384 modules with a 2-chips-per-row design. Note that the numbers provided herein are presented by way of example only. Thus, the potential capacity scales up as the number of chips per row increases. This is not achievable in a conventional machining method.

Figure 1A:
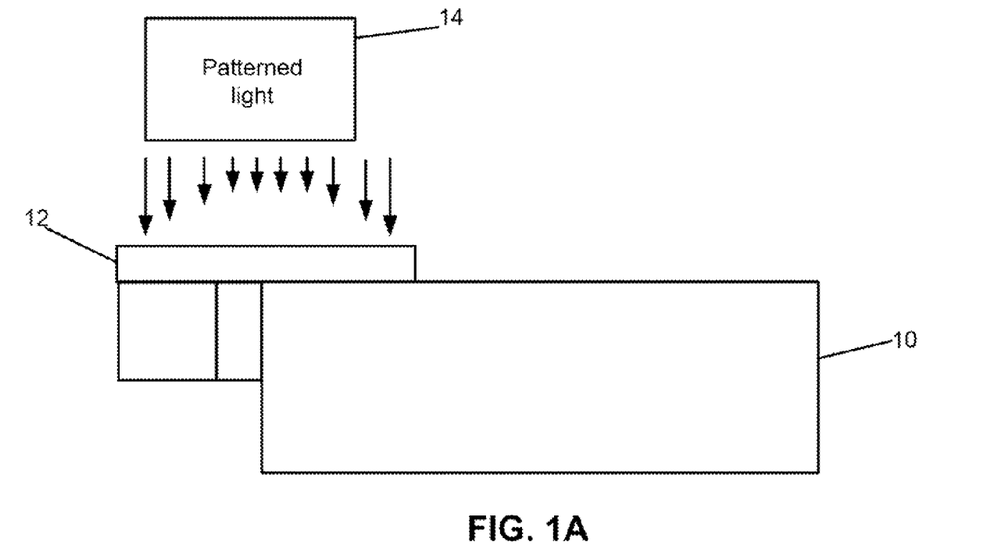
FIGS. 1A-1F are graphical depictions of a process for patterning a device according to one embodiment.

At the start of the process, a carrier of 16 row bars are arranged with tape bearing surfaces abutted together. Referring to FIG. 1A, the surface to be profiled is coated with positive or negative photoresist 12 (also referred to herein simply as a resist) to a specific, desired thickness. Note that the photoresist may be applied to targeted areas in some approaches, and full film in others. As will soon become apparent, the thickness of the photoresist may be selected based on the desired final shape, exposure conditions, etc., all as would be apparent to one skilled in the art after reading this specification. An illustrative range of photoresist thickness is about 2 microns to about 20 microns, preferably about 5 to about 30 microns, though the thickness used could be higher or lower. Any photoresist application technique may be used, such as spin coating, spraying, etc. In this example, assume the resist is a positive photoresist, such as the commercially available resist, AZ9260 available from AZ Electronic Materials USA Corp. (New Jersey), 70 Meister Avenue, Branchburg, N.J. 08876 USA. If needed, the resist can be baked or otherwise cured to form photo resist of the desired thickness.

The target final profile, which may include a generally sloped surface, a curved (e.g., rounded, arcuate, etc.) surface, a stepped surface, etc. and combination thereof, is digitized and scaled according to the resist properties, and converted to a machine readable format, such as a gray scale bitmap file. The target final profile generally refers to the desired profile of the target surface after the processing is complete, and can be based on modeling, graphical design, computer-aided design (CAD), etc. See FIG. 1E for the actual final profile of the device 10. The machine readable file is then used to generate a MOEMS input file in a manner known in the art. With continued reference to FIG. 1A, this file is used to control a programmable MOEMS array 14 to produce the desired, graded resist exposure. Because the exposure varies spatially, the resulting resist mask will also have a spatially variable developer etch rate that corresponds to the light exposure. The exposed resist is then developed to produce the final resist shape.

Note that the developed photoresist and surface to be profiled may etch at different rates. For example, an etch rate difference between the photoresist and the substrate may be in a range of about 1:1 and about 4:1. In one approach, the MOEMS input file is computed by multiplying the target profile heights by the etch rate ratio. The resist should be at least as thick as the maximum peak to valley difference in the final surface. Non-linearities in the resist development or etch are easily compensated for in the bitmap.

Figure 1B:
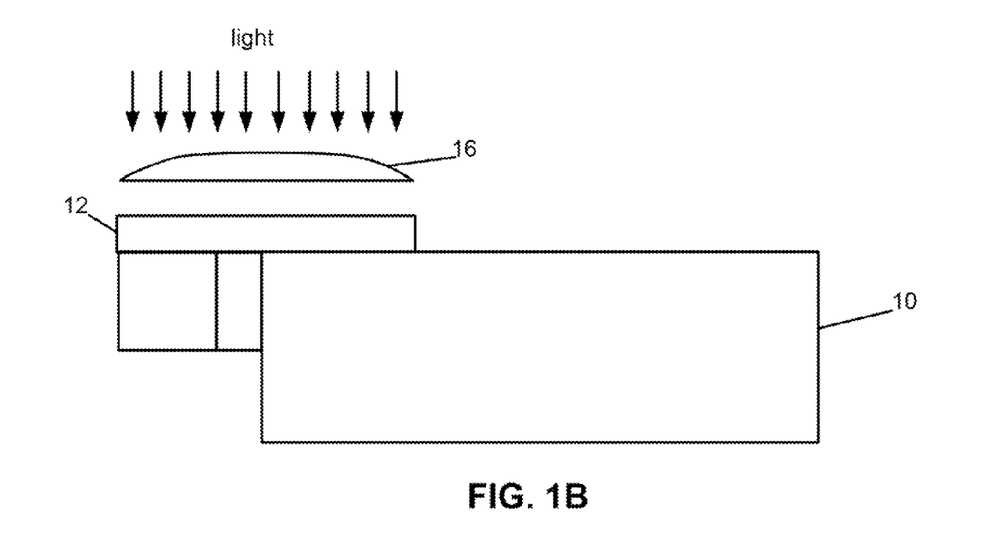

FIG. 1B depicts an alternate method for exposing the resist 12. In this embodiment, a graded photo mask 16 is used to provide a similar exposure as the MOEMS maskless method. In this approach, light exposure is controlled by the graded photo mask, where an amount of radiation passing through the photo mask varies with the grading of the photo mask.. Light traversal through the photo mask may be a function of mask thickness, mask opacity at given portions thereof, etc. For example, the graded photo mask may include grayscale pixels that regulate how much light traverses each pixel region. Thus, the grading can be, e.g., from 1-8 shades, 1-64 shades, 1-256 shades, etc. where each shade represents a degree of opacity, preferably from substantially transparent to opaque, or any range in between. The graded photo mask 16 may be created using a mathematically-generated representation of the target surface shape, e.g., a machine readable version of the target final profile. The mathematical representation may be computer-generated, created by man, etc.

Figure 1C:
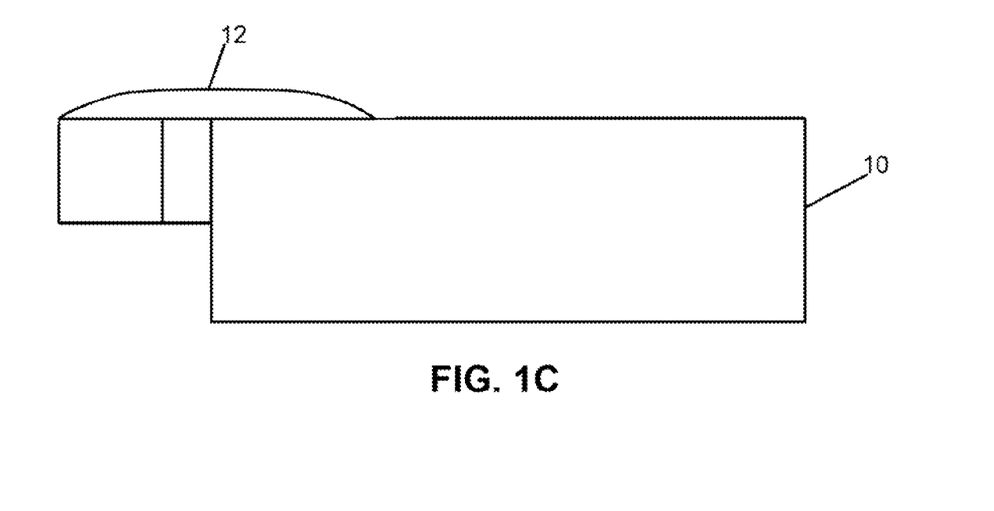

Referring to FIG. 1C, the resist 12 is then developed. Note that the resist profile is depicted as contoured to conceptually depict the etching resistance thereof. The actual profile of the resist may, but need not necessarily, appear as depicted. Preferably, the center of the resist pattern is centered about over the transducers. Presented by way of example only, for a tape head having a closure length of 280 microns, and a gap length of 30 microns, the total width of the resist pattern in the direction of tape travel can be about 400-800 microns. The flatter portion at the peak of the resist can be as small as about 10 to about 20 microns in length or less. The wall profile of the resist may be oriented at an angle of up to about 12 degrees relative to the underlying surface. The resist deposition thickness may be about 8 to about 20 microns. Of course these ranges are illustrative only and higher and/or lower values may be used in a given implementation.

Figure 1D:
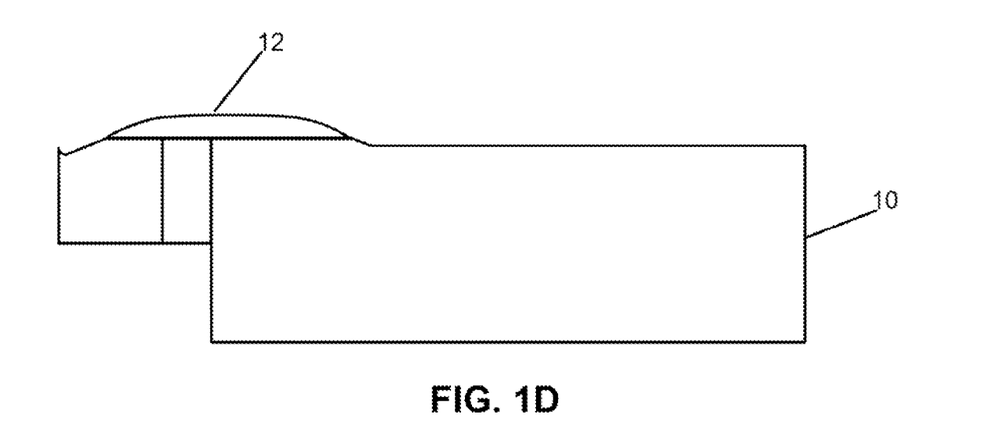

Referring to FIG. 1D, a subtractive process is performed on the surface. During the subtractive process, the resist blocks the etching of the surface thereunder, and it is also removed by the etching process. After the resist is completely removed at given location, the surface at that location begins to be etched away. In the meantime previously exposed areas continue to etch at about a constant rate. The delayed onset of etching caused by the variable-thickness-developed photoresist produces the final profile.

Figure 1E:
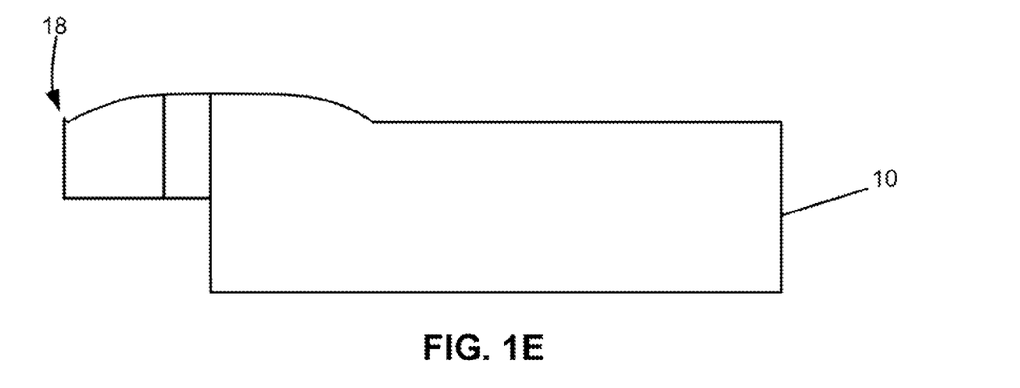
Figure 1F:
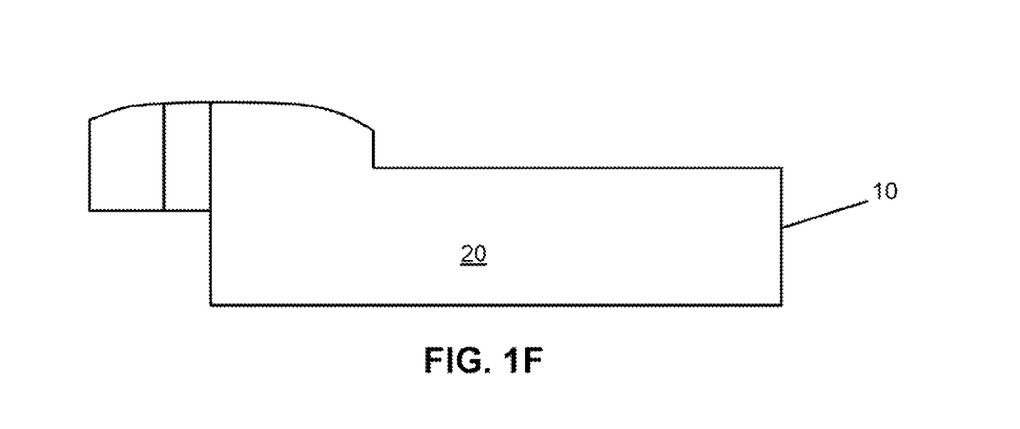

Referring to FIG. 1E, the resist is removed. In some approaches, a feature 18 such as a lip may appear near the edge of the substrate. In such case, it may be desirable to dice, grind, or otherwise remove the lip and/or portion of the substrate having the lip, resulting, e.g., in the structure shown in FIG. 1F. Note also that the head wafer 20, e.g., of AlTiC, has been ground.

In one illustrative approach for forming a tape head component, and presented by way of example only, a contiguous area of the substrate affected by the subtractive process has a generally curved cross sectional surface shape with a local minimum curvature radius of about 1 mm. See also FIG. 5.

In another illustrative approach for forming a tape head component, and presented by way of example only, a contiguous area of the substrate affected by the subtractive process has a generally planar or generally curved cross sectional surface shape with a linear distance in an intended direction of tape travel thereover of about 100 microns to about 200 microns from a leading edge to a portion not affected by the subtractive process, the contiguous area having a subtracted distance from about 0 at an end of the contiguous area adjacent the portion not affected by the subtractive process to >0 microns to about 10 microns near the leading edge.

Note that the grading of the photoresist may be two dimensional, as well as three dimensional. To demonstrate a three dimensional case, assume that the resist is only graded in portions not aligned with the transducers in a direction of intended tape travel thereacross. The result may be a head having a skiving edge near the transducers of the tape head module and a contoured region formed by the subtractive process and along a same end of the tape head module as the skiving edge. See FIGS. 4A-4C for such an embodiment.

Figure 2A:
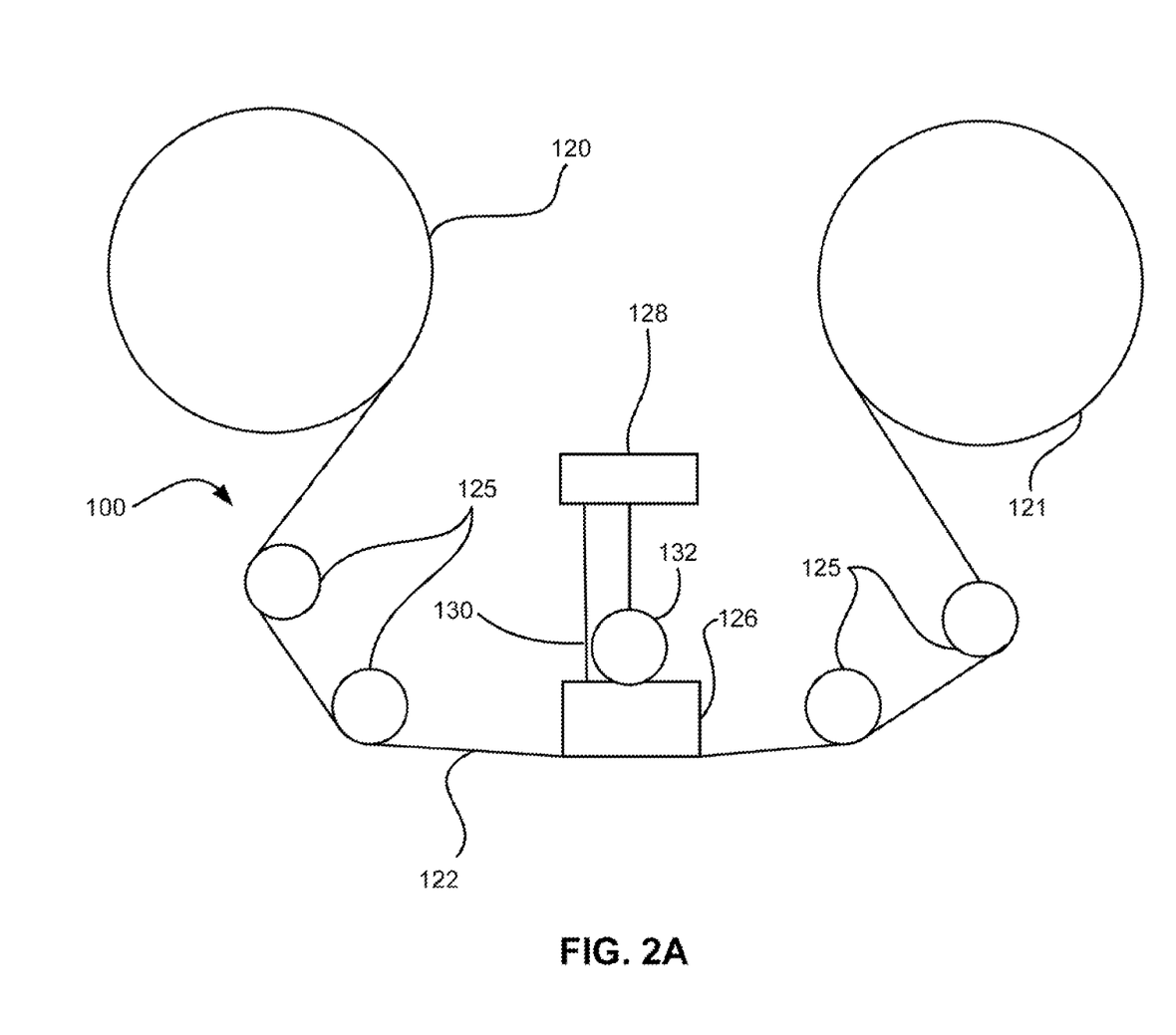
FIG. 2A is a schematic diagram of a simplified tape drive system according to one embodiment.

FIG. 2A illustrates a simplified tape drive 100 of a tape-based data storage system, which may be employed in the context of the present invention. While one specific implementation of a tape drive is shown in FIG. 2A, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2A, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art.

Figure 2B:
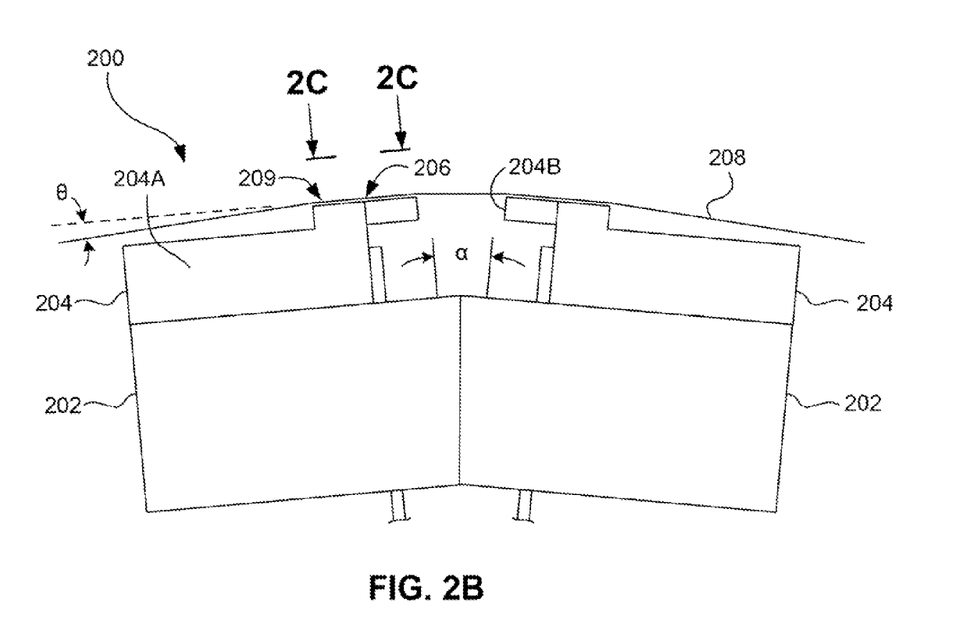
FIG. 2B illustrates a side view of a flat-lapped, bi-directional, two-module magnetic tape head according to one embodiment.

By way of example, FIG. 2B illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a gap 206 comprising readers and/or writers situated therebetween. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

Figure 2C:
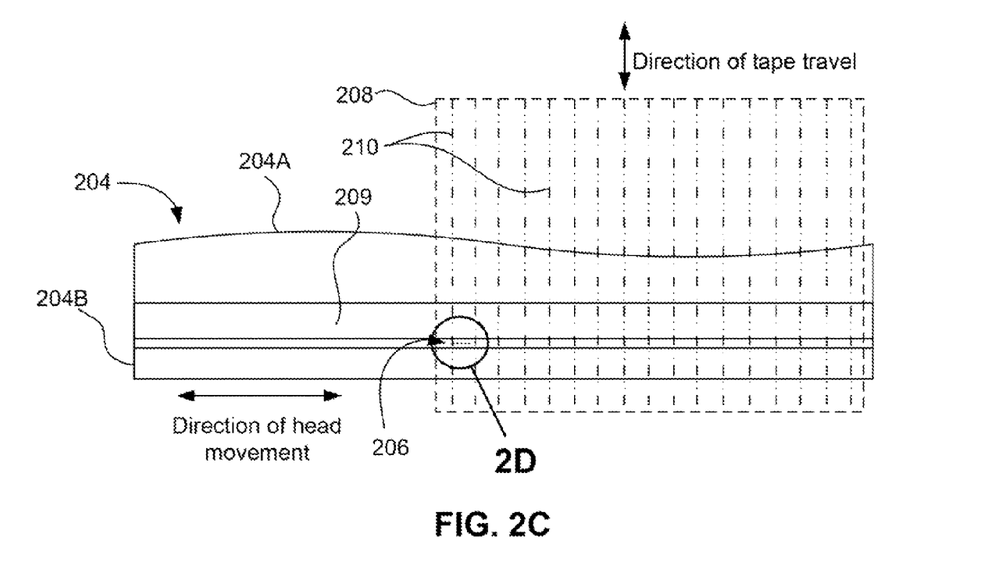
FIG. 2C is a tape bearing surface view taken from Line 2C of FIG. 2.

FIG. 2C illustrates the tape bearing surface 209 of one of the modules 204 taken from Line 2C of FIG. 2C. A representative tape 208 is shown in dashed lines. The module 204 is preferably long enough to be able to support the tape as the head steps between data bands. Note that the tape bearing surface need not be flat, and may have some curvature along at least a portion thereof.

In this example, the tape 208 includes 4 to 22 data bands, e.g., with 16 data bands and 17 servo tracks 210, as shown in FIG. 2C on a one-half inch wide tape 208. The data bands are defined between servo tracks 210. Each data band may include a number of data tracks, for example 512 data tracks (not shown). During read/write operations, the elements 206 are positioned to specific track positions within one of the data bands. Outer readers, sometimes called servo readers, read the servo tracks 210. The servo signals are in turn used to keep the elements 206 aligned with a particular set of tracks during the read/write operations.

Figure 2D:
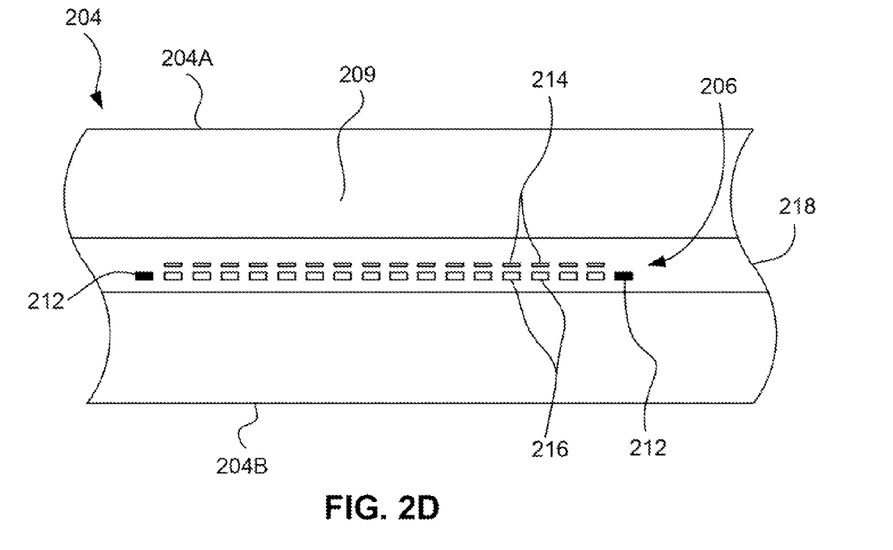
FIG. 2D is a detailed view taken from Circle 2D of FIG. 2C.

FIG. 2D depicts a plurality of read and/or write elements 206 formed in a gap 218 on the module 204 in Circle 2D of FIG. 2C. As shown, the array of elements 206 includes, for example, 16 writers 214, 16 readers 216 and two servo readers 212, though the number of elements may vary. Illustrative embodiments include 8, 16, 32, and 40 elements per array 206. A preferred embodiment includes 32 readers per array and/or 32 writers per array, where the actual number of transducing elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2D, the readers 216 and writers 214 may also be arranged in an interleaved configuration. Alternatively, each array of elements 206 may be readers or writers only, and the arrays may contain one or more servo readers 212. As noted by considering FIGS. 2 and 2C-B together, each module 204 may include a complementary set of elements 206 for such things as bi-directional reading and writing, read-while-write capability, backward compatibility, etc.

Figure 2E:
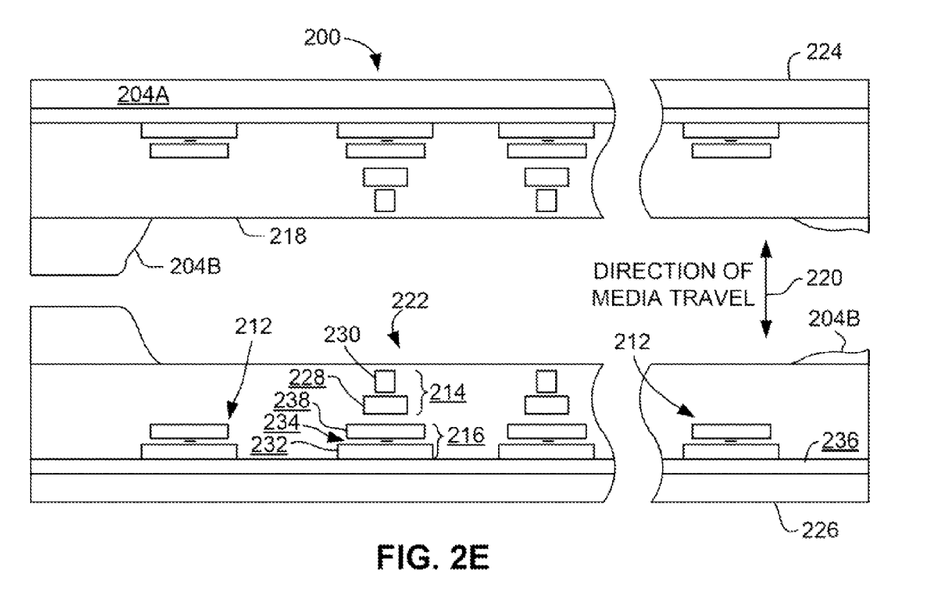
FIG. 2E is a detailed view of a partial tape bearing surface of a pair of modules.

FIG. 2E shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 3A:
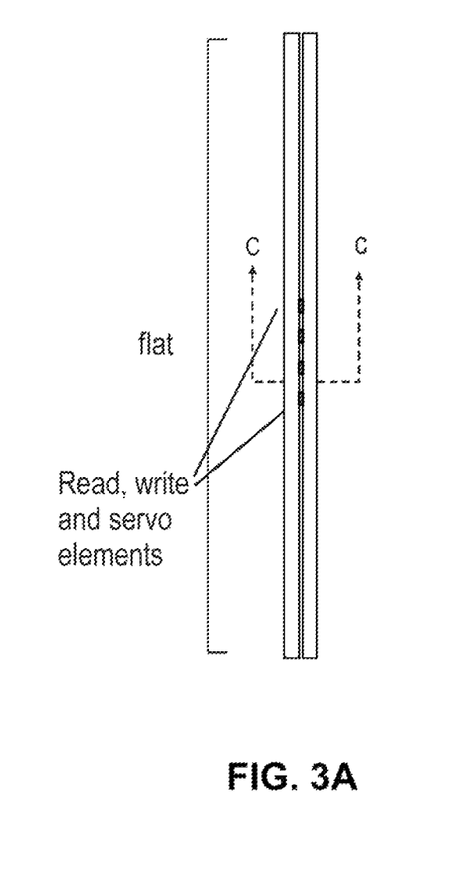
FIG. 3A shows a tape-based data storage system, in accordance with one embodiment.
Figure 3B:
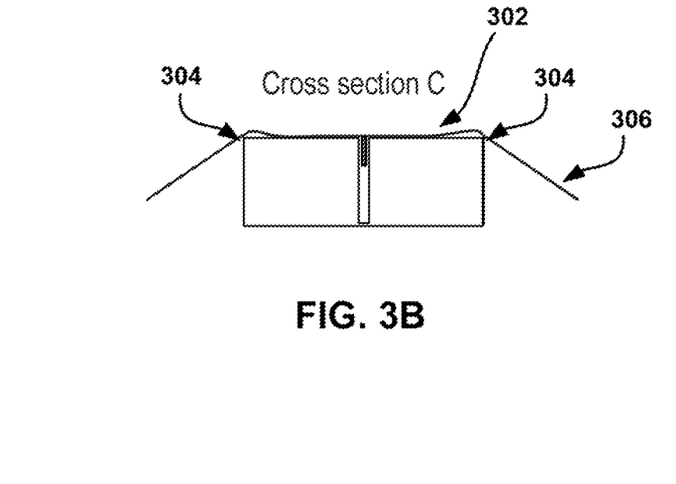
FIG. 3B shows a cross section of the tape-based data storage system of FIG. 3A, in accordance with one embodiment.

In modern linear data recording, the magnetic tape (e.g. a tape approximately 12 mm wide) passes over a head structure including read/write elements localized to a much shorter region, about 3 mm across, illustrated in FIGS. 3A and 3B. As shown, the tape bearing surface 302 includes a sharp edge 304 where a tape 306 first touches the head. This "skiving" edge serves to prevent air from being drawn into the head-tape gap, so that atmospheric pressure pushes the tape into contact with the read/write elements. Even a small amount of roundness or slope at the incoming edge may generate an air bearing, separating the tape from the head and rendering high density recording impossible. In some head designs, before the tape passes over this head portion, the tape passes over an additional separated portion, or "outrigger," which positions the tape to approach the skiving edge at the correct wrap angle.

As mentioned above, future systems of high areal density will likely implement smoother heads and tapes. However, this causes increased startup friction (stiction), increased running friction, and more instantaneous speed variations (ISVs). In addition, tape-head wear may limit tape lifetime, and contact-generated debris can adhere to the head, increasing the magnetic spacing.

Figure 4A:
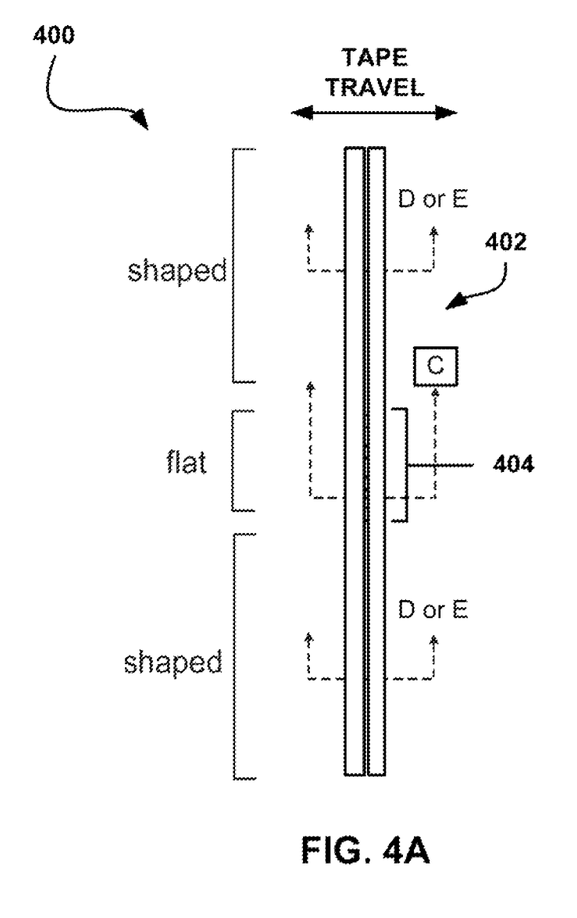
FIG. 4A shows a tape-based data storage system, in accordance with one embodiment.

FIG. 4A shows a tape-based data storage system 400, in accordance with one embodiment. As shown, the system 400 includes a head 402 (a module of which is shown in FIG. 4A) having a tape bearing surface and an array of transducers 404 in the tape bearing surface, the transducers being selected from a group consisting of readers, writers and servo readers. Furthermore, a length of the array 404 is defined between outer ends of the outer transducers thereof, and may or may not include any servo readers present. Thus, as an option, the outer transducers may be the servo readers. In other various embodiments, the outer transducers may be any transducer used during a given reading or writing operation. In this case, the outer transducers may not necessarily be the outermost transducers present on the head 402.

Figure 4B:
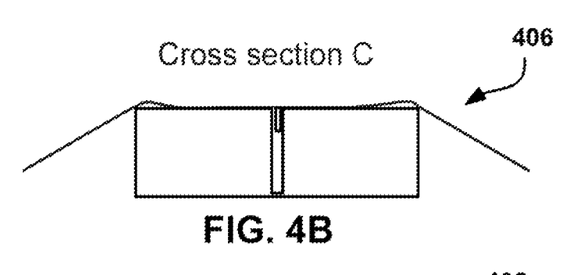
FIGS. 4B-4D show cross sections of the tape-based data storage system of FIG. 4A, in accordance with one embodiment.
Figure 4C:
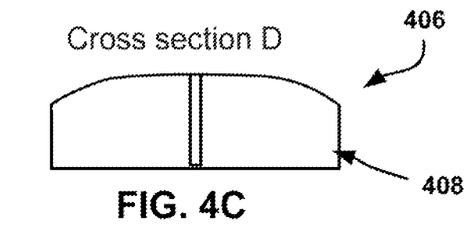
Figure 4D:
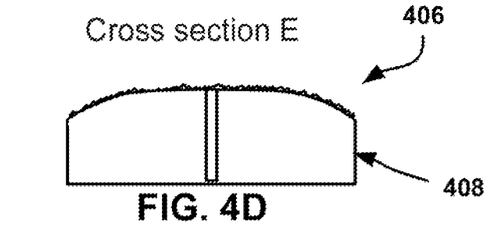

In operation, the head 402 induces a formation of a larger spacing between a tape 406 and portions of the tape bearing surface 408 positioned laterally to the array in a direction about perpendicular to a direction of tape travel thereacross than between the tape 406 and a contiguous portion of the tape bearing surface spanning across multiple transducers in the array, as shown in FIGS. 4B-4D. For example, the region with the closer spacing may extend across two or more of the transducers in the array. In another approach, the region with the closer spacing may extend at least half way along the length of the array 404 in front of or behind the array 404 relative to the direction of tape travel thereacross. In one embodiment, the larger spacing may be formed by an air bearing between the tape 406 and the portions of the tape bearing surface 408 positioned laterally to the array 404. Furthermore, the system 400 may be configured such that no air bearing is formed over a majority of the array 404 (e.g. see FIG. 4B).

As an option, an edge of the tape bearing surface may extend about perpendicular to a direction of tape travel thereacross, the edge having a continuous skiving edge in front of the array 404, as shown in FIGS. 4B-4D. In one approach, the skiving edge has a continuous, uninterrupted length that is at least as long as a plurality of the transducers in the array as measured between outer ends of the transducers. In one embodiment, the skiving edge may have a length that is greater than about 50% of the array length. Additionally, the skiving edge may promote a contiguous area of contact between the tape 406 and the array 404 along a majority of a length of the array 404 (e.g. see FIG. 48). As an option, the contiguous portion may extend beyond the length of the array 404.

Figure 5:
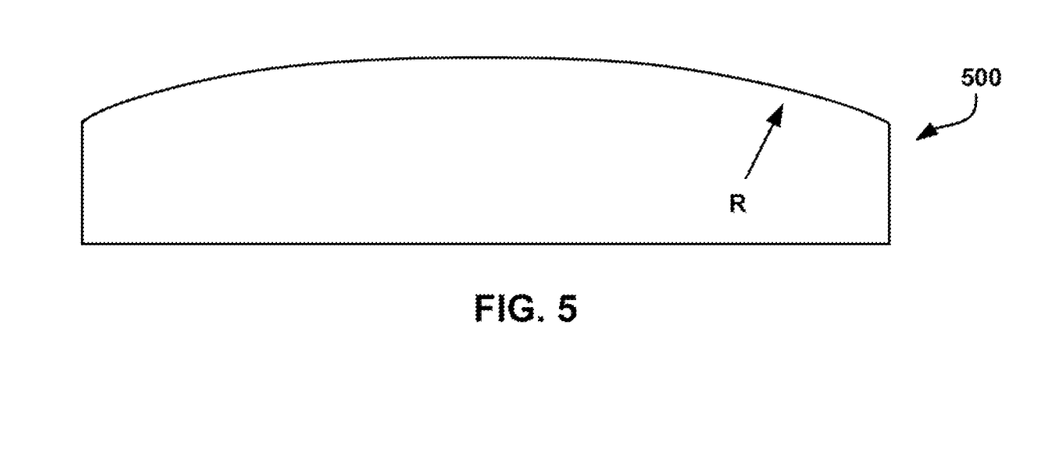
FIG. 5 shows a magnetic head structure, in accordance with one embodiment.

In another embodiment, outer portions of the edge of the tape bearing surface flanking the skiving edge may have a shape adapted for inducing formation of an air bearing between the tape and the tape bearing surface therebehind (e.g. see FIGS. 4C and 4D). In one approach, the outer portions of the edge of the tape bearing surface may have a rounded shape, as shown in FIG. 5. Of course, however, the portions of the edge flanking the skiving edge may have any shape that induces an air bearing, such as, but not limited to, a curved shape, an angled shape, a tiered shape, and/or any shape that induces an air bearing.

As an option, the tape bearing surface may be predominantly rounded. For example, 50% to 100% of the tape bearing surface may be rounded. In still another embodiment, the tape bearing surface may be predominantly planar or coplanar. For example, 50% to 100% of the tape bearing surface may be about planar or coplanar. Moreover, a contiguous area of the substrate affected by the subtractive process may have a generally curved cross sectional surface shape with a local minimum curvature radius of about 1 mm.

In one embodiment, the portions of the tape bearing surface positioned laterally to the array 404 may be rough, as shown in FIG. 4D. In the context of the present description, rough refers to any deviation from planar and smooth. For example, in various embodiments, the portions of the tape bearing surface positioned laterally to the array may be textured, bumped, roughened in a traditional sense, ridged, laser etched, wavy, discontinuous, and/or any other periodic and/or random deviation from smooth.

In one embodiment, the peak height may be approximately 30-200 nm with respect to the average taken over a region of 10 µM×10 µm. In this case, the surface finish may be chosen to give a small real contact area, but smooth enough not to cause excessive tape wear. Furthermore, the depth may be large enough not to be worn away during contact, but small enough not to protrude through the air bearing.

In this way, only the portion where the tape 406 contacts the surface will generate significant running friction. For example if the magnetic elements span a length of only about ¼ of the width of the tape 406, the running friction will be reduced by about a factor of three to four.

Numerical solutions of beam bending and Reynolds air flow equations for the air-bearing indicate that an air bearing may be formed from a wide variety of head shapes. FIG. 5 shows a profile of a magnetic head structure 500, in accordance with one embodiment. In this case, the head 502 has a length of L=0.6 mm with a generally cylindrical surface profile. For a radii of R=2.5 to 10 mm, a tape tension of 0.7 N, a tape velocity between 2 and 12 m/s, and a stiffness of 1-10 mg/µm, as defined in the LTO (Linear Tape-Open) tape specifications, the head structure 500 supports air bearings. Furthermore, the distance of closest approach of the tape to the head ranges from 0.1 to 2 µm, as a function of these parameters.

It should be noted that, in some cases, changing the overall shape of the head to form an air bearing may not strongly affect stiction because the compliant tape may conform to the head shape. Thus, roughening may be utilized for reducing head-tape friction. However, in some situations, such roughening may increase tape wear. Additionally, the topography may be filled by tape debris or worn away by the tape.

Combining shaping and roughening may alleviate both running friction and stiction. The roughened surface reduces the real contact in the air bearing region such that there is very little stiction force from this area, even when the tape is starting from zero velocity. Further, because the tape lifts off this region as soon as the tape speed is appreciable, very little sliding contact occurs.

Figure 6A:
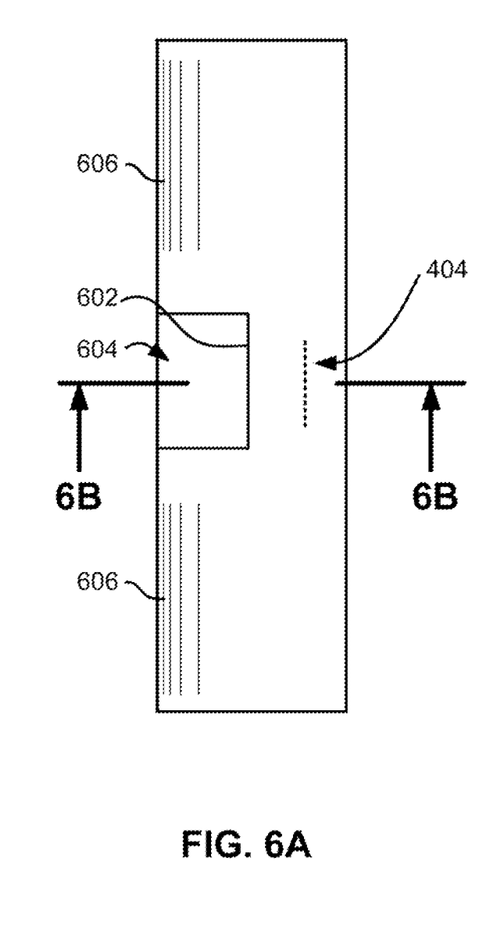
FIG. 6A shows a magnetic head structure, in accordance with one embodiment.
Figure 6B:
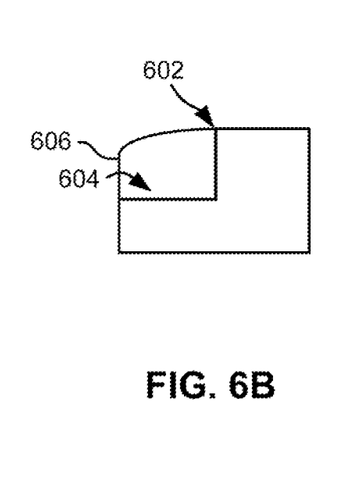
FIG. 6B is a cross sectional view taken from Line 6B of FIG. 6A.

FIGS. 6A and 6B illustrate another embodiment of a magnetic head structure 600, This embodiment includes a skiving edge 602 positioned above a slot 604 and outer portions 606 flanking the slot. The outer portions 606 behave similarly to the outer portions described above in other embodiments, and further may be shaped to define the wrap angle of the tape relative to the skiving edge 602.

Figure 7A:
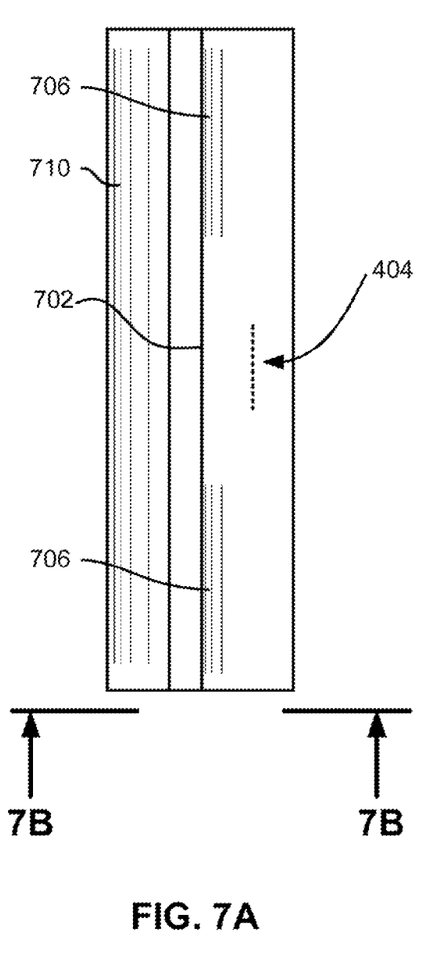
FIG. 7A shows a magnetic head structure, in accordance with one embodiment.
Figure 7B:
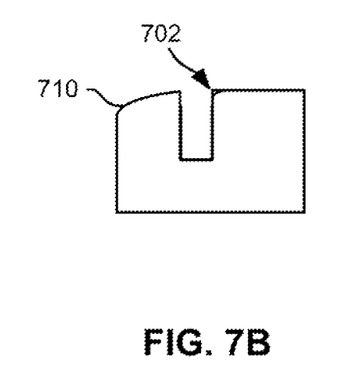
FIG. 7B is a side view taken from Line 7B of FIG. 7A.

FIGS. 7A and 7B illustrate another embodiment of a magnetic head structure 700, This embodiment includes a skiving edge 702 and outer portions 706 flanking the slot. The outer portions 706 behave similarly to the outer portions described above in other embodiments. Also included is an outrigger 710 that is shaped to define the wrap angle of the tape relative to the skiving edge 702.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
applying photoresist to a substrate;
exposing the photoresist such that a local intensity of radiation applied to the photoresist at each pixel thereof is a function of a mathematically-generated representation of a target surface shape;
developing the resist; and
performing a subtractive process on the developed photoresist and the substrate for creating the target surface shape on the substrate,
wherein the substrate includes a tape head module,
wherein the target surface shape of the tape head module includes a skiving edge near transducers of the tape head module and a contoured region formed by the subtractive process and along a same end of the tape head module as the skiving edge.

2. A method as recited in claim 1, wherein a portion of the substrate exposed to the subtractive process comprises a ceramic.

3. A method as recited in claim 1, wherein the substrate includes a slider for a hard disk drive.

4. A method as recited in claim 1, wherein a contiguous area of the substrate affected by the subtractive process has a generally planar or generally curved cross sectional surface shape with a local minimum curvature radius of about 1 mm.

5. A method as recited in claim 1, wherein the mathematically-generated representation is used to create a graded photo mask, wherein an amount of radiation passing through the photo mask varies with the grading of the photo mask.

6. A method as recited in claim 1, wherein the photoresist is exposed using a maskless process.

7. A method as recited in claim 6, wherein the photoresist is exposed using a Micro-Opto-ElectroMechanical System.

8. A method as recited in claim 1, wherein the subtractive process includes at least one of milling and etching.

9. A method as recited in claim 1, wherein the target surface shape includes a generally sloped surface.

10. A method as recited in claim 1, wherein the target surface shape includes a generally curved surface.

11. A method as recited in claim 1, wherein portions of the developed photoresist are removed more quickly during the subtractive process than others as a result of exposure to the different amounts of radiation, wherein new areas of the substrate progressively become exposed during the subtractive process and are affected by the subtractive process.

12. A method as recited in claim 1, wherein an etch rate difference between the photoresist and the substrate is in a range of about 1:1 and about 4:1.

13. A method as recited in claim 12, wherein a thickness of the photoresist is in a range of about 5 and about 30 microns.

14. A method as recited in claim 1, wherein a contiguous area of the substrate affected by the subtractive process has a generally curved cross sectional surface shape with a local minimum curvature radius of about 1 mm.

15. A method, comprising:
applying a photoresist to a substrate;
patterning the photoresist using a machine-readable profile; and
performing a subtractive process to transfer the profile onto the substrate,
wherein the substrate includes a tape head module,
wherein the target surface shape of the tape head module includes a skiving edge near transducers of the tape head module and a contoured region formed by the subtractive process and along a same end of the tape head module as the skiving edge.

16. A method as recited in claim 15, wherein portions of the developed photoresist are removed more quickly during the subtractive process than others as a result of exposure to the different amounts of radiation, wherein new areas of the substrate progressively become exposed during the subtractive process and are affected by the subtractive process.

17. A method as recited in claim 15, wherein a contiguous area of the substrate affected by the subtractive process has a generally curved cross sectional surface shape with a local minimum curvature radius of about 1 mm.

\* \* \* \* \*